United States Patent
Chung et al.

(10) Patent No.: US 7,535,050 B2
(45) Date of Patent: May 19, 2009

(54) MEMORY STRUCTURE WITH HIGH COUPLING RATIO

(75) Inventors: Chih-Ping Chung, Linluo Township, Pingtung County (TW); Chun-Nan Lin, Changhua (TW); Chung-Yi Chen, Jhonghe (TW); Hung-Kwei Liao, Longtan Township, Taoyuan County (TW)

(73) Assignee: ProMos Technologies Inc., Hsinchu (TW)

( * ) Notice: Subject to any disclaimer, the term of this patent is extended or adjusted under 35 U.S.C. 154(b) by 221 days.

(21) Appl. No.: 11/272,683

(22) Filed: Nov. 15, 2005

(65) Prior Publication Data
US 2007/0052008 A1   Mar. 8, 2007

(30) Foreign Application Priority Data
Sep. 5, 2005   (TW) ................. 94130391 A

(51) Int. Cl.
*H01L 29/94*   (2006.01)
(52) U.S. Cl. .................. 257/315; 257/E29.3
(58) Field of Classification Search .......... 257/314, 257/213, 296, 313, 315, 316, 317, 318, 319, 257/320, 321, 322, 323, E29.129, E29.3, 257/E29.301, E29.302, E29.303, E29.304, 257/E29.305, E29.306, E29.307, E29.308, 257/E29.309
See application file for complete search history.

(56) References Cited

U.S. PATENT DOCUMENTS

| 5,686,329 | A * | 11/1997 | Chang et al. ............ 438/253 |
| 5,710,054 | A * | 1/1998 | Gardner et al. ........... 438/304 |
| 6,232,630 | B1 * | 5/2001 | Ramsbey et al. ........ 257/314 |
| 6,284,597 | B1 * | 9/2001 | Hong ...................... 438/257 |
| 6,532,176 | B1 * | 3/2003 | Kushnarenko ....... 365/185.25 |
| 6,548,352 | B1 * | 4/2003 | Rhodes .................. 438/257 |
| 2003/0032273 | A1 * | 2/2003 | Tseng ..................... 438/594 |
| 2003/0218208 | A1 * | 11/2003 | Lin et al. ................ 257/316 |
| 2004/0224469 | A1 * | 11/2004 | Lim et al. ............... 438/285 |

FOREIGN PATENT DOCUMENTS

CN    1303127    7/2001

* cited by examiner

*Primary Examiner*—Evan Pert
*Assistant Examiner*—Kevin Quinto
(74) *Attorney, Agent, or Firm*—Rosenberg, Klein & Lee

(57) ABSTRACT

A memory structure comprising a plurality of memory cells is described. Each memory cell comprises a substrate, a shallow trench isolation, a spacer, a tunnel oxide, and a floating gate. The shallow trench isolation in the substrate is used to define an active area. The spacer is at the sidewall of the shallow trench isolation and is higher than the shallow trench isolation. The tunnel oxide is on the active area. The floating gate is on the tunnel oxide.

12 Claims, 4 Drawing Sheets

MEMORY STRUCTURE WITH HIGH COUPLING RATIO

RELATED APPLICATIONS

The present application is based on, and claims priority from, Taiwan Application Ser. No. 94130391, filed Sep. 5, 2005, the disclosure of which is hereby incorporated by reference herein in its entirety.

BACKGROUND

1. Field of Invention

The present invention relates to a memory. More particularly, the present invention relates to a memory structure with high coupling ratio.

2. Description of Related Art

Memory-related technology is progressing rapidly. Because of the high market demand for lighter, thinner and smaller products, flash memory is extensively used and has become a main nonvolatile memory nowadays. Because the physical size of the memory is becoming smaller and smaller, the size of each memory cell within the memory structures also must be made smaller, which results in decreasing the overlapping area of a floating gate and a control gate in each memory cell. Therefore, the coupling ratio of the floating gate and the control gate decreases. Because of low coupling ratio, the memory requires a higher voltage applied on its control gate to function. Not only the efficiency of the memory but also the reliability of the memory becomes less over a long time. Moreover, the conventional memory has a serious parasitic transistor effect that is described in detail below.

FIG. 1 to FIG. 3 show a conventional nonvolatile memory cell at different steps of the manufacturing process. In FIG. 1, a shallow trench isolation 106 in a substrate 102 can be used to define an active area 111 of a memory cell. A pad oxide 103 is located on the substrate 102. A liner oxide 104 is located around the shallow trench isolation 106. The pad oxide 103 functions as a buffer layer between a hard mask and the substrate 102. After the hard mask is removed, the surface of the shallow trench isolation 106 is apparently higher than that of the substrate 102.

Reference is made to FIG. 2. A wet etching process is performed to remove the pad oxide 103 from the substrate 102, and the upper surface of the shallow trench isolation 106 is lowered to approximate to the upper surface of the substrate 102. Then, a tunnel oxide 105 is formed at the same place where the pad oxide 103 originally is. Since the wet etching process used to remove the pad oxide 103 is isotropic, the side of the shallow trench isolation 106 is usually etched to form a concave portion 109.

In FIG. 3, a polysilicon layer is deposited on the substrate 102. Then, lithography and etching processes are performed on the polysilicon layer to form a floating gate 108. When the polysilicon layer is deposited on the substrate 102, some polysilicon material also fills in the concave portion 109 at the side of the shallow trench isolation 106. The presence of the polysilicon in the concave portion 109 causes difficulties in performing the subsequent etching process. Furthermore, there is likely an electric leakage in the region of the concave portion 109, which adversely effects the operation and reliability of the memory.

SUMMARY

It is therefore an aspect of the present invention to provide a memory structure, wherein the overlapping area of the floating gate and the control gate in a memory cell is large and the memory has high coupling ratio, and the memory thus can read and write data faster.

Another aspect of the present invention relates to a memory structure, wherein a concave portion is not formed on the side of shallow trench isolation, and thus electric leakage is reduced.

In accordance with the foregoing aspects, one embodiment of the present invention provides a memory structure. The memory structure comprises a plurality of memory cells, wherein each of the memory cells comprises a substrate, a shallow trench isolation, a spacer, a tunnel oxide, and a floating gate. The shallow trench isolation is in the substrate and is for defining an active area. The spacer is at the sidewall of the shallow trench isolation. The top of the spacer is higher than the surface of the shallow trench isolation. The tunnel oxide and the floating gate are on the active area sequentially.

Since the spacer protects the edge of the shallow trench isolation from being etched and from being grooved in the etching process, electric leakage does not occur when the memory is functioning. Furthermore, the fact that the top of the spacer is higher than the surface of the shallow trench isolation results in a curvature on the surface of the floating gate when the floating gate is formed on the substrate. The surface area of the floating gate is therefore increased, which allows a greater overlapping area between the floating gate and the control gate and, increases the coupling ratio of the memory structure. Accordingly, the memory of the present invention can function more efficiently and is more reliable.

BRIEF DESCRIPTION OF THE DRAWINGS

The invention can be more fully understood by reading the following detailed description of the preferred embodiments, with reference made to the accompanying drawings as follows.

DETAILED DESCRIPTION OF THE PREFERRED EMBODIMENTS

The memory structure described herein is mainly a nonvolatile memory, particularly a flash memory. A flash memory is exemplified below to illustrate the characteristics and the concept of the present invention.

A flash memory is composed of a plurality of memory cells. Each of the memory cells is isolated by an isolation structure. In a preferred embodiment of the present invention, the isolation structure is a shallow trench isolation. Since each memory cell has the same structure, the description below only describes the structure of a single memory cell.

Figure 1:
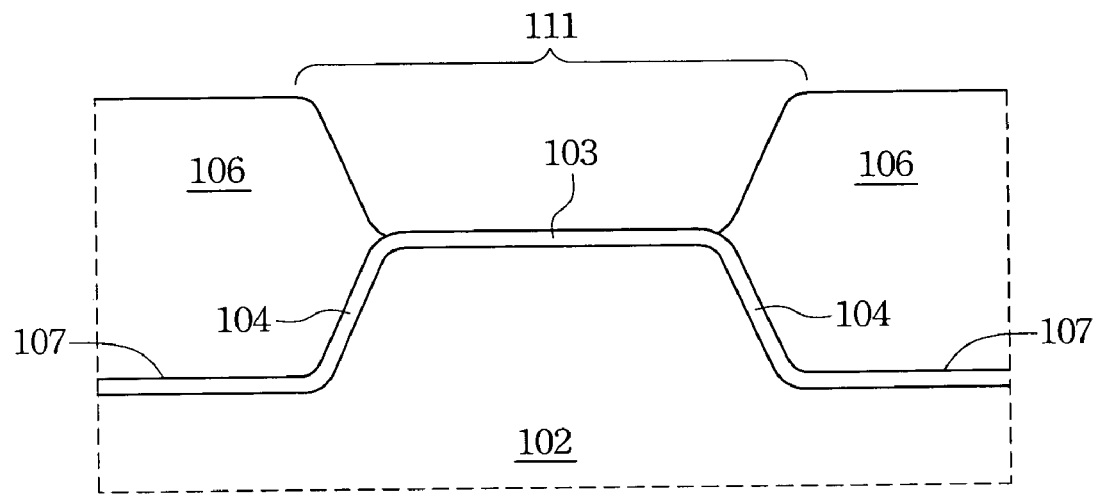
FIG. 1 to FIG. 3 are cross-sectional side views of a conventional nonvolatile memory cell at different steps of the manufacturing process.
Figure 2:
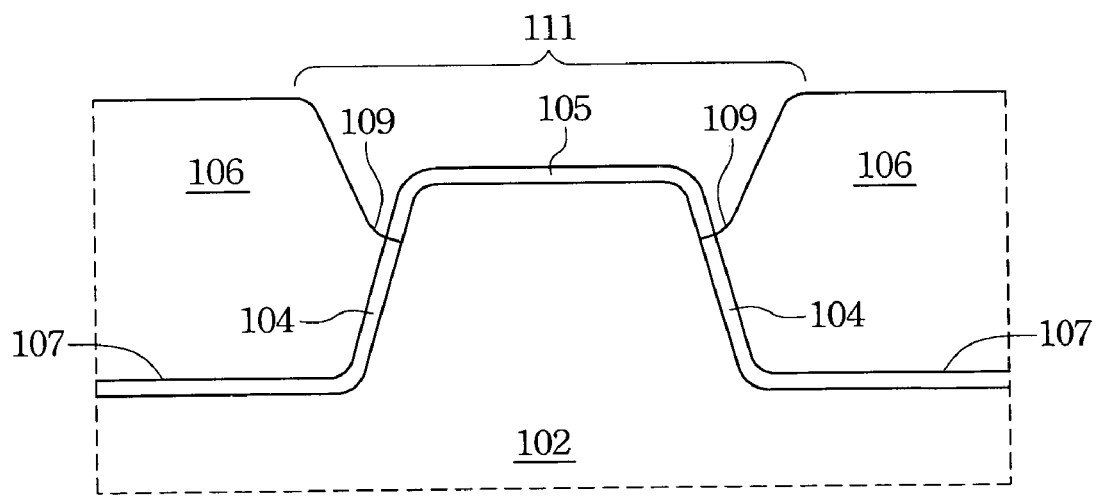
Figure 3:
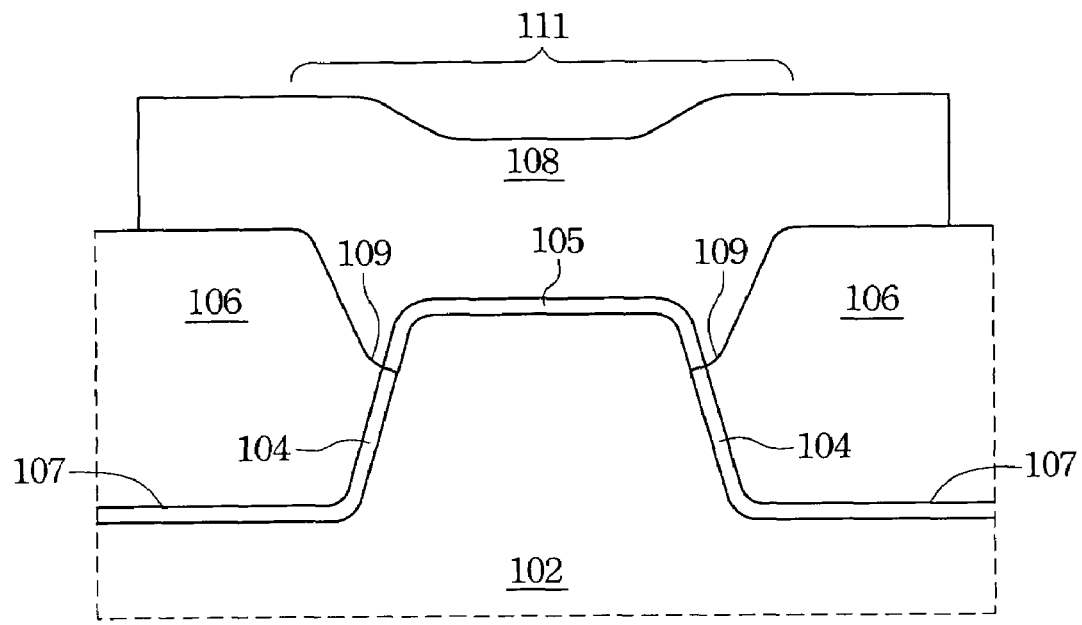
Figure 4:
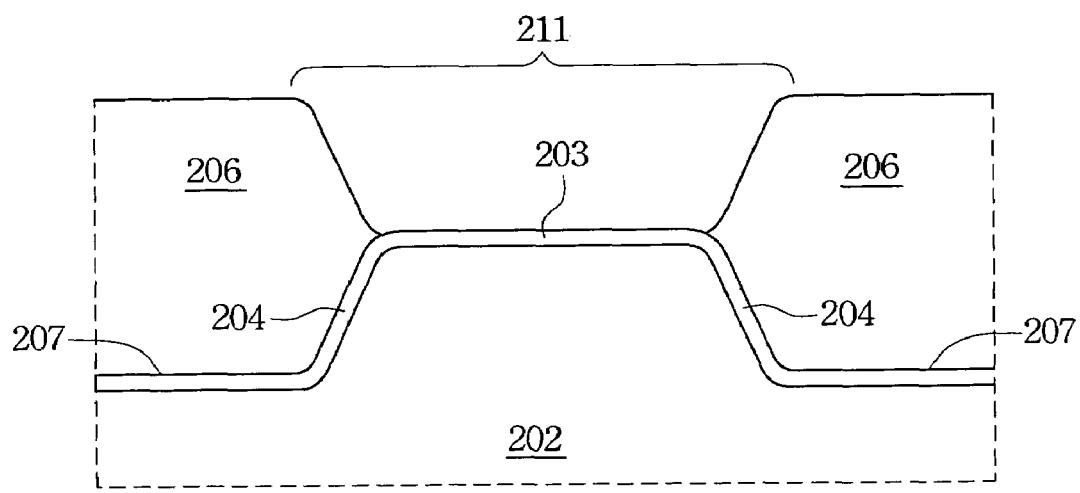
FIG. 4 to FIG. 8 are cross-sectional side views of a nonvolatile memory cell at different steps of the manufacturing process according to a preferred embodiment of the present invention.

FIG. 4 is a cross-sectional side view of a memory cell when shallow trench isolations are formed. A shallow trench isolation 206 located in a substrate 202 is for defining an active area 211 of a memory cell. Furthermore, a pad oxide 203 is on the surface of the substrate 202 and serves as a buffer layer between a hard mask and the substrate 202. Around the shallow trench isolation 206 is a liner layer, e.g. a liner oxide 204. In a preferred embodiment of the present invention, the substrate 202 comprises silicon. To form the structure shown in FIG. 4, a pad oxide 203 is first formed on the substrate 202 by oxidation at high temperature. Next, a silicon nitride layer is deposited thereon as a hard mask for a subsequent etching process. Before the etching process is performed, the pattern on a photoresist is transferred to the hard mask by lithography and etching. The patterned hard mask is used as an etch mask in the etching process, so as to form a shallow trench 207 in the substrate 202. A liner oxide 204 is then formed on the shallow trench 207. Finally, the shallow trench 207 is filled with an isolation material, such as silicon oxide, to form a shallow trench isolation 206. The shallow trench 207 is generally formed by an anisotropic etching process.

Figure 5:
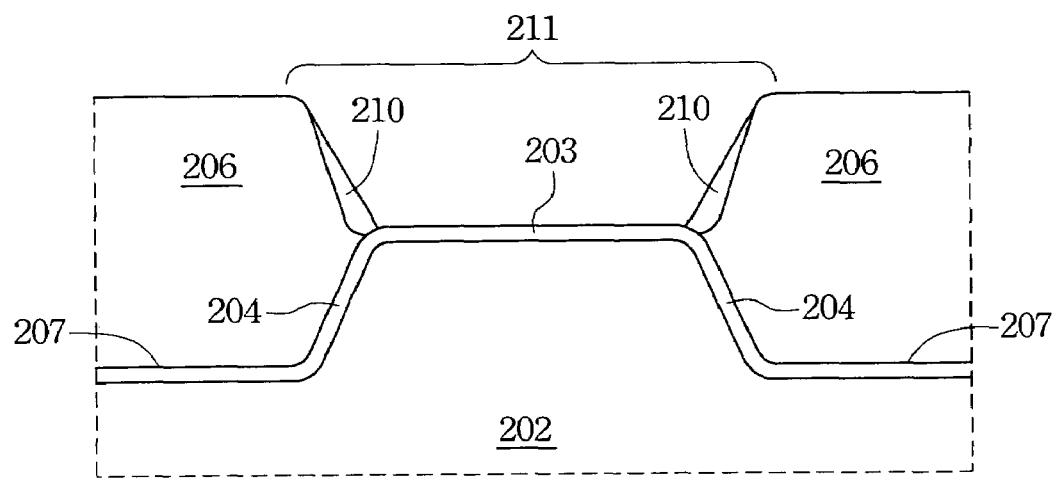

Reference is made to FIG. 5, which is a cross-sectional side view showing a structure after forming a spacer at the sidewall of the shallow trench isolation. First, a spacer material layer is deposited on the substrate 202. The spacer material layer is then etched by anisotropic etching to form a spacer 210 at the sidewall of the shallow trench isolation 206. The material of the spacer material layer is a dielectric material like silicon nitride, silicon oxynitride, doped polysilicon, or silicon oxide having an etching rate slower than the material of the shallow trench isolation. The deposition method can be, for example, chemical vapor deposition (CVD) or high temperature oxidation (HTO). As shown in FIG. 5, the spacer 210 covers the sidewall of the shallow trench isolation 206, thereby preventing a concave portion from forming.

Figure 6:
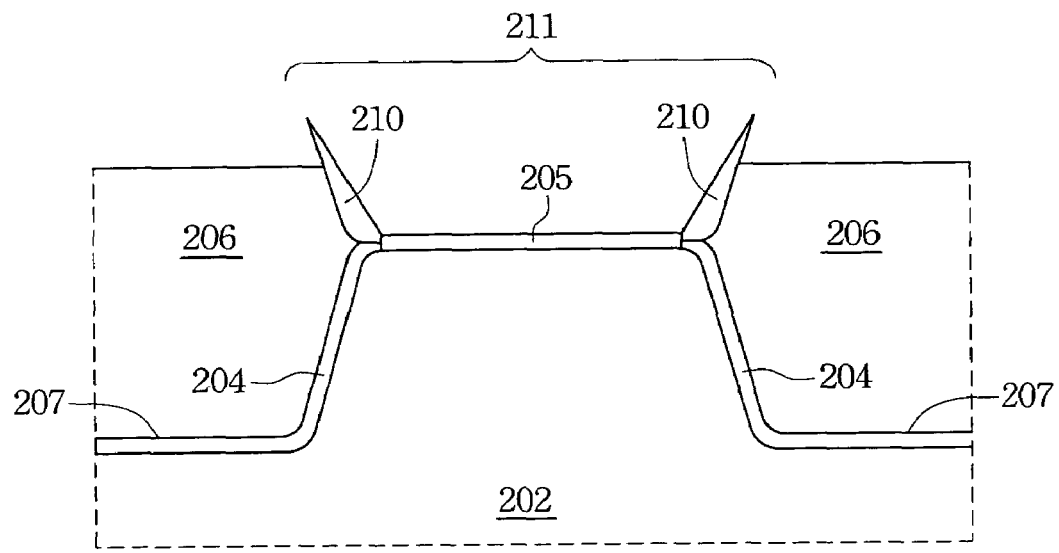

FIG. 6 shows a cross-sectional side view of a memory cell when forming a tunnel oxide. First, the pad oxide 203 is removed. At the same place where the pad oxide 203 is originally, a tunnel oxide 205 is formed. When removing the pad oxide 203, the upper surface of the shallow trench isolation 206 is lowered approximate to the upper surface of the substrate 202, and the spacer 210 therefore protrudes from the surface of the substrate 202 and the shallow trench isolation 206. The tunnel oxide 205 is formed by, for instance, a thermal oxidation process.

In a preferred embodiment of the present invention, the removal of the pad oxide 203 and the reduction of the height of the shallow trench isolation 206 are performed by isotropic etching, preferably by a wet etching. The solution for the wet etching can be hydrofluoric acid, diluted hydrofluoric acid or buffered hydrofluoric acid, which is determined according to the required quality and etching rate.

Figure 7:
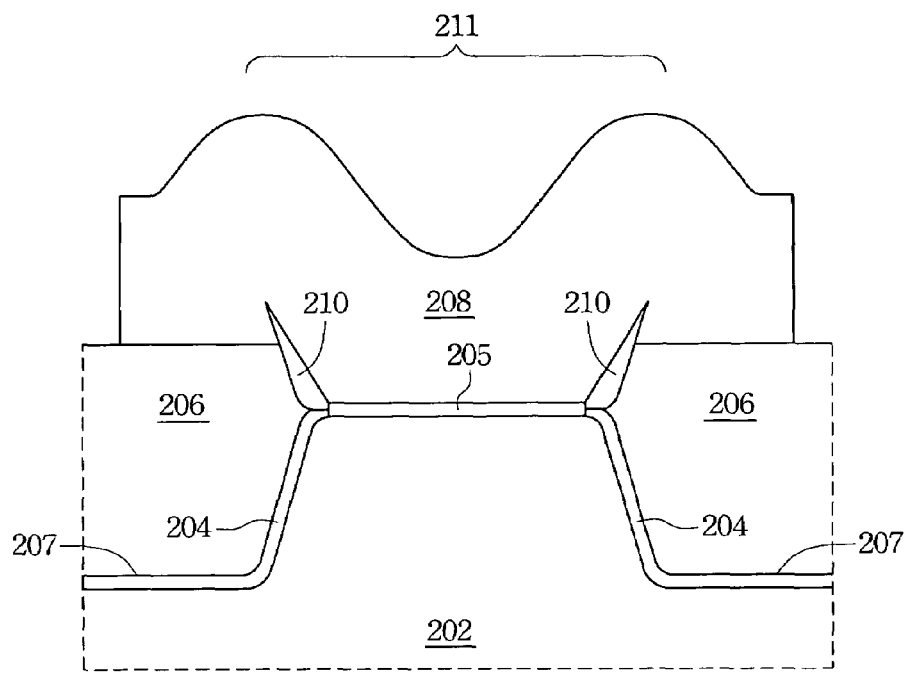

FIG. 7 is a cross-sectional side view of a memory cell when forming a floating gate. The material of the floating gate 208 can be polysilicon, amorphous silicon, silicon nitride or other materials that can store electrical charges. In this embodiment, the material of the floating gate is polysilicon. The floating gate 208 is formed by depositing polysilicon and subsequently performing lithography and etching processes. The thickness of the floating gate 208 above the spacer 210 is greater than the thickness of the floating gate 208 above the tunnel oxide 205, such as shown in FIG. 7.

Figure 8:
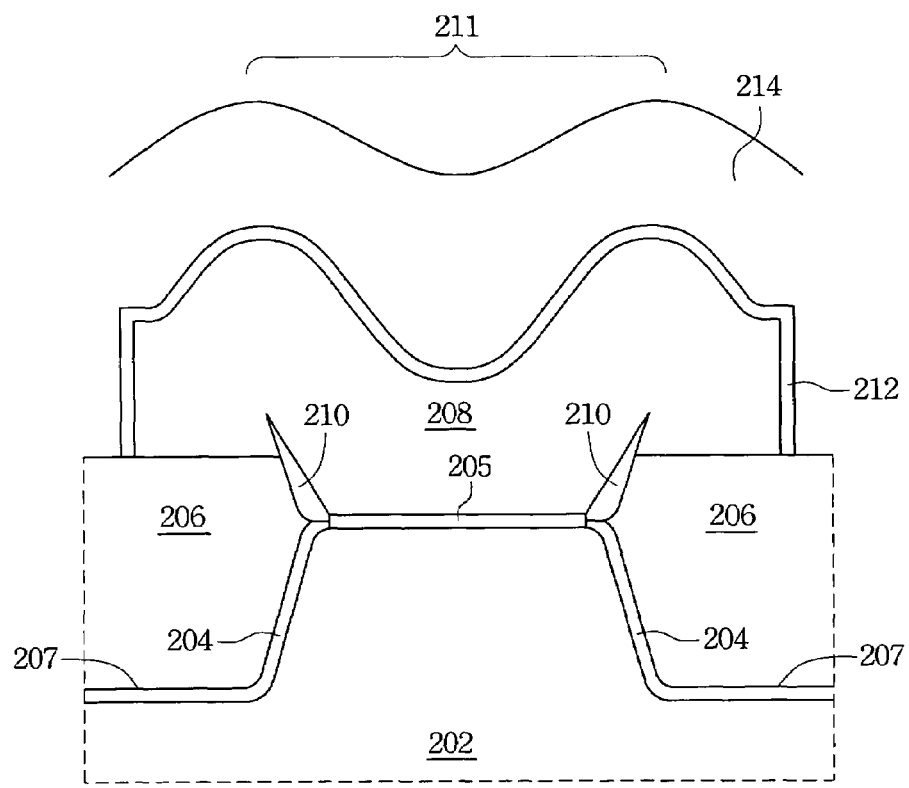

FIG. 8 shows a cross-sectional side view of a memory cell when forming a gate dielectric and a control gate. In a preferred embodiment, the gate dielectric 212 is formed on the floating gate 208. Preferably, the gate dielectric is silicon oxide/silicon nitride/silicon oxide, and the material of the control gate is polysilicon. Finally, a control gate 214 is formed by depositing polysilicon on the substrate 202 and then performing lithography and etching processes.

In another embodiment of the present invention, the memory cell is formed by sequentially depositing a polysilicon layer, a gate dielectric layer and a polysilicon layer, and then performing lithography and etching processes to define the floating gate 208, the gate dielectric 212, and the control gate 214.

The term "coupling ratio" is used to indicate the overlapping area of the control gate 214 with the floating gate 208. As the coupling ratio increases, the operation efficiency of memory is improved and the memory can be erased at a higher speed. Generally, the coupling ratio can be increased by the thickness reduction of the gate dielectric 212. However, increasing the coupling ratio by this method is limited since the thickness of the gate dielectric 212 generally ranges from a minimum of 80 Å to 90 Å.

In the memory structure of the preferred embodiment, the top of the spacer 210 is higher than the upper surface of the shallow trench isolation 206. When the floating gate 208 is formed on the spacer, the surface of the floating gate 208 is rippled and thus the surface areas of the floating gate 208, the gate dielectric 212 and the control gate 214 thereon are also increased. Therefore, the overlapping area between the floating gate 208 and the control gate 214 is increased, and the coupling ratio is increased.

Accordingly, the present invention has the following advantages.

(1) The memory structure of the embodiment comprises a spacer to protect the edge of the shallow trench isolation so that a problem of corner oxide thinning that usually occurs in the concave portion at the sidewall of the shallow trench isolation can be avoided. Also, no unwanted materials are left in the concave portion, and thus electric leakage is reduced.

(2) The special design of the memory structure of the embodiment, i.e. the top of the spacer is higher than the upper surface of the shallow trench isolation, allows greater surface areas of the floating gate, the gate dielectric and the control gate. Therefore, the overlapping area of the floating gate and the control gate is increased, and the coupling ratio thereof increases.

(3) The memory structure of the embodiment has high coupling ratio, and thus has better efficiency and higher reliability.

The preferred embodiments of the present invention described above should not be regarded as limitations of the present invention. It will be apparent to those skilled in the art that various modifications and variations can be made to the present invention without departing from the scope or spirit of the invention. The scope of the present invention is as defined in the appended claims.

What is claimed is:

1. A memory structure comprising a plurality of memory cells, each of the memory cell comprising:

a substrate;

a shallow trench isolation located in the substrate for defining an active area;

a spacer located at a sidewall of the shallow trench isolation, wherein a top of the spacer is higher than an upper surface of the shallow trench isolation;

a liner oxide located between the substrate and the shallow trench isolation and the substrate and the spacer;

a tunnel oxide located on the active area, where in a bottom of the spacer is higher than a bottom on the tunnel oxide; and a floating gate with curving shape overlaying the tunnel oxide and the spacer, wherein a thickness of the floating gate above the spacer is larger than a thickness of the floating gate above the tunnel oxide.

2. The memory structure of claim 1, wherein the material of the spacer is silicon oxide having an etching rate slower than the material of the shallow trench isolation.

3. The memory structure of claim 1, wherein the material of the spacer is silicon nitride.

4. The memory structure of claim 1, wherein the material of the spacer is silicon oxynitride.

5. The memory structure of claim 1, wherein the material of the spacer is doped polysilicon.

6. The memory structure of claim 1, wherein the material of the floating gate is polysilicon, amorphous silicon or silicon nitride.

7. The memory structure of claim 1, further comprising:
a gate dielectric located on the floating gate; and
a control gate located on the gate dielectric.

8. A memory structure with a high coupling ratio, comprising:
a substrate;
a shallow trench isolation located in the substrate;
a spacer located at a sidewall of the shallow trench isolation, wherein a top of the spacer is higher than an upper surface of the shallow trench isolation;
a liner oxide located between the substrate and the shallow trench isolation and the substrate and the spacer;
a tunnel oxide located on the substrate, wherein a bottom of the spacer is higher than a bottom of the tunnel oxide;
a floating gate overlaying the tunnel oxide and the spacer, wherein a thickness of the floating gate above the spacer is larger than a thickness of the floating gate above the tunnel oxide;
a gate dielectric located on the floating gate; and
a control gate located on the gate dielectric.

9. The memory structure of claim 8, wherein the liner oxide layer is located on an inner surface of the shallow trench isolation.

10. The memory structure of claim 8, wherein the material of the spacer is silicon nitride.

11. The memory structure of claim 8, wherein the material of the spacer is silicon oxide having an etching rate slower than the material of the shallow trench isolation.

12. The memory structure of claim 8, wherein the material of the floating gate is polysilicon, amorphous silicon or silicon nitride.

* * * * *